(12) United States Patent
Kim

(10) Patent No.: US 6,376,903 B1
(45) Date of Patent: Apr. 23, 2002

(54) SEMICONDUCTOR CHIP PACKAGE WITH MULTILEVEL LEADS

(75) Inventor: Jae Hoon Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/557,799

(22) Filed: Apr. 25, 2000

(30) Foreign Application Priority Data

Oct. 6, 1999 (KR) .............................. 99-43015

(51) Int. Cl.⁷ .............................................. H01L 23/02
(52) U.S. Cl. ........................ 257/678; 257/692; 257/787
(58) Field of Search .............................. 257/678, 692, 257/693, 695, 696, 787, 666; 174/52.4

(56) References Cited

U.S. PATENT DOCUMENTS

| | | | |
|---|---|---|---|
| 4,801,765 A | | 1/1989 | Moyer et al. |
| 4,862,245 A | | 8/1989 | Pashby et al. |
| 5,287,000 A | * | 2/1994 | Takahashi et al. .......... 257/676 |
| 5,535,509 A | | 7/1996 | Tomita et al. |
| 5,554,886 A | * | 9/1996 | Song .......................... 257/666 |
| 5,744,827 A | * | 4/1998 | Jeong et al. ................. 257/686 |
| 5,819,403 A | * | 10/1998 | Crane, Jr. et al. ............. 29/841 |
| 5,909,053 A | * | 6/1999 | Fukase et al. ............... 257/666 |
| 6,016,003 A | * | 1/2000 | Uemura ....................... 257/666 |
| 6,080,931 A | * | 6/2000 | Park et al. .................. 174/52.4 |

* cited by examiner

*Primary Examiner*—Lincoln Donovan
*Assistant Examiner*—Kyung S. Lee
(74) *Attorney, Agent, or Firm*—Skjerven Morill MacPherson LLP; David W Heid

(57) ABSTRACT

A semiconductor chip package includes a semiconductor chip having a plurality of contact pads, a plurality of first leads, a plurality of second leads and a housing. Each of the first leads includes an inner lead portion which is electrically coupled to an associated contact pad on the semiconductor chip, and an outer lead portion which extends from the inner lead portion and is exposed outside of the package. The second leads are disposed in an overlapping relationship with the first leads and are electrically insulated from the first leads. The second leads each include an inner lead portion electrically coupled to an associated contact pad on the semiconductor chip and an outer lead portion which extends from the inner lead portion and is exposed outside the package. The housing encapsulates the semiconductor chip and the inner lead portions of the plurality of first and second leads.

7 Claims, 3 Drawing Sheets

SEMICONDUCTOR CHIP PACKAGE WITH MULTILEVEL LEADS

FIELD OF THE INVENTION

The present invention relates to a semiconductor chip package with multilevel leads, and more particularly, to a semiconductor chip package which can minimize the chip package size and reduce the resistance of the leads.

DESCRIPTION OF THE BACKGROUND ART

In view of the use of large scale integration, large storage capacity, high speed and the multi-function of semiconductor memory devices in recent years, a semiconductor chip package for these devices has become larger due to the increasing number of input/output pins. Chip packages have become a perfect square due to the increased memory storage capacity, the high speed capacity of semiconductor memory elements, and the increased number of input/output pins for data.

Accordingly, U.S. Pat. Nos. 4,862,245 and 5,535,509 disclose lead-on-chip (LOC) packages for reducing a chip size of a semiconductor memory chip package. However, size reduction is limited because the leads must have at least a certain width and interval in a LOC package.

As shown in FIG. 1, a conventional semiconductor chip package is constructed with a molded material such as plastic or resin epoxy, encapsulating a semiconductor chip 10, bonding wires 14, inner leads 16, while outer leads 18 are exposed from the molded housing 20. Contact pads 12 of the semiconductor chip are electrically coupled to the inner leads 16 via the bonding wires 14. The exposed outer leads 18 are electrically connected to conductive lines of a printed circuit board (not shown).

For minimizing the resistance and coupling resistance, the outer leads 18 have a larger width relative to the inner leads 16. The length of a longer side of the package is determined according to that of a longer side of a lead frame, independent of a chip itself, since the leads are arranged in a certain interval.

Accordingly, it is desirable to reduce the length of a longer side of the lead frame for minimizing the package size in a LOC package.

U.S. Pat. No. 4,801,765 discloses the structure having multilevel lead frames, in which inner leads on an upper frame are interdigitated with those of a lower frame in a quad package and outer leads of the upper frame are coplanar with outer leads of the lower frame. The package size is not reduced in this structure.

U.S. patent appln. Ser. No. 60/032,575 filed on Dec. 4, 1996 discloses a multilevel lead frame having signal leads and conductive sides in a quad package. However, certain leads to which a power supply voltage and a ground voltage are applied are formed as conductive sides, and a plurality of signal leads are disposed above the conductive sides. Accordingly, the plurality of signal leads are arranged at a certain interval and width on the same plane so that it is difficult to provide a small chip package.

SUMMARY OF THE INVENTION

According to the present invention, a semiconductor chip package is provided with multilevel leads which minimizes the package size by laminating leads to form multilevel leads. This reduces the resistive components and coupling resistance of leads by providing increased width of leads.

To accomplish the foregoing, a semiconductor chip package according to the present invention is provided which comprises a semiconductor chip having a plurality of contact pads.

The package includes a plurality of first leads each including an inner lead portion which is electrically coupled to an associated contact pad on the semiconductor chip, and an outer lead portion which extends from the inner lead portion and is exposed outside the package. A plurality of second leads are disposed overlapping the plurality of first leads and are electrically insulated from the first plurality of leads. Each lead of the second plurality of leads includes an inner lead portion electrically coupled to an associated contact pad on the semiconductor chip and an outer lead portion which extends from the inner lead portion and is exposed outside the package. A molded housing encapsulates the semiconductor chip and the inner lead portions of the first and second plurality of leads.

Each outer lead portion of the first leads is bent downward at 90 degrees, and then bent toward the housing at 90 degrees. Preferably, each outer lead portion of the second leads is bent downward at 90 degrees, and then bent away from the housing at 90 degrees. Also, the first leads are formed in a lower lead frame, and the second leads are formed in an upper lead frame. The inner ends of the first leads are longer than the inner ends of the second leads by an amount sufficient to provide an area for wire bonding to the first leads.

According to another aspect of the present invention, a device includes a semiconductor chip; a plurality of first and second leads; and a housing. The semiconductor chip includes a plurality of contact pads. The plurality of first and second leads each include inner lead portions and outer lead portions. The inner lead portions of each of the first and second leads are electrically coupled to an associated contact pad, and disposed overlapping and insulated from each other. The outer lead portions of the first and second leads, which are exposed outside, are reciprocally disposed at the same plane. The housing encapsulates the semiconductor chip and the inner lead portions of the plurality of first and second leads.

According to still another aspect of the present invention, a device includes a semiconductor chip, a plurality of first leads, a plurality of second leads and a housing. The plurality of first leads each include inner lead portions and outer lead portions. The inner lead portions are electrically coupled to associated contact pads on the semiconductor chip, and include straight portions and oblique portions which extend from the straight portions at a predetermined angle. The outer lead portions extend from the oblique portions of the inner lead portions and are bent in a first direction.

The plurality of second leads each include an inner lead portion, an outer lead portion and an oblique portion. The inner lead portions of the second leads are disposed overlapping the straight inner lead portions of the first leads and are electrically insulated from the first leads. The inner lead portions of the second leads are electrically coupled to associated contact pads on the semiconductor chip. The oblique portions extend from the inner lead portions at a predetermined angle. The terminating ends of the outer lead portions are coplanar with the terminating ends of the outer lead portions of the first leads. The housing encapsulates the semiconductor chip and the inner lead portions and the oblique portions of the plurality of first and seconds leads.

BRIEF DESCRIPTION OF THE ATTACHED DRAWINGS

DETAILED DESCRIPTION OF THE INVENTION

Figure 1:
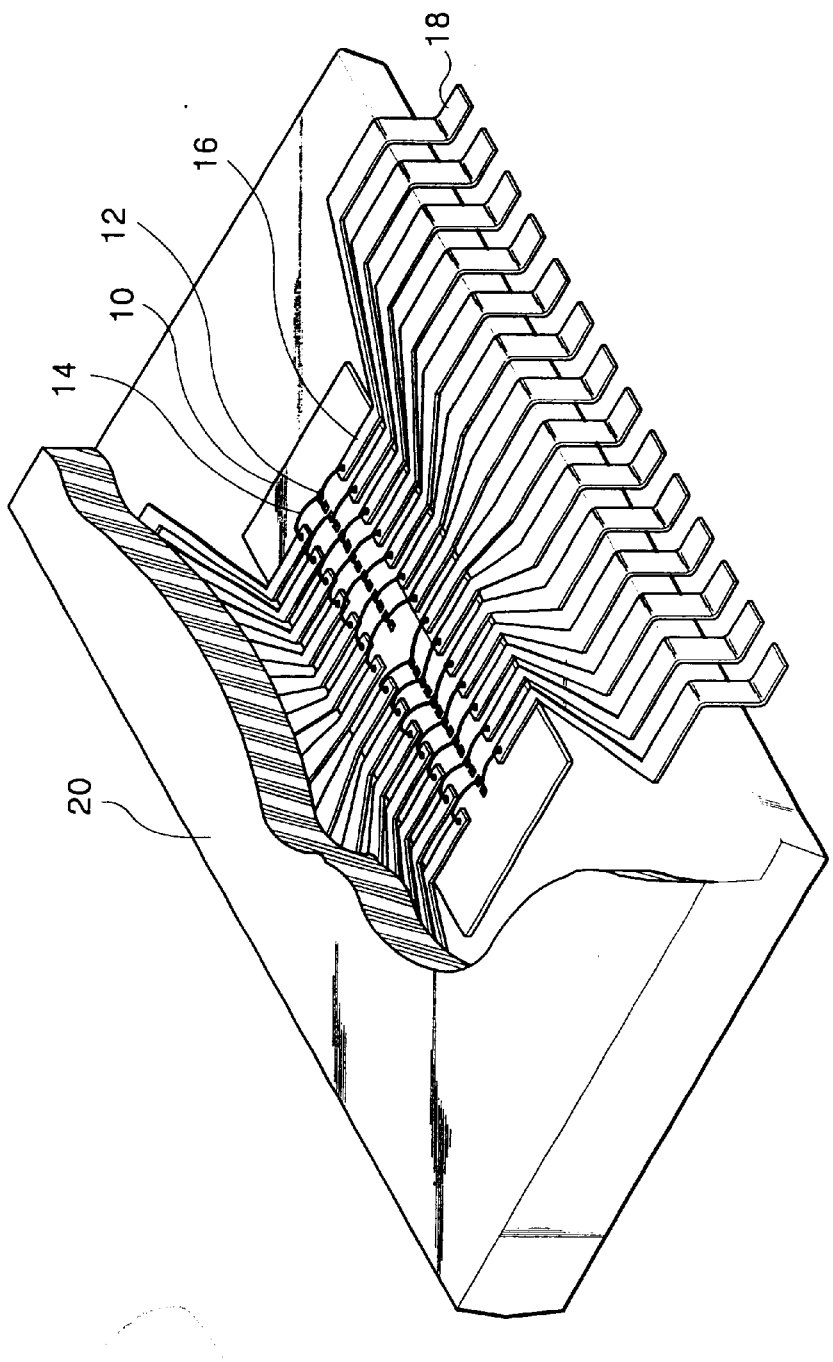
FIG. 1 illustrates a lead-on-chip package of a prior art semiconductor memory device.
Figure 2:
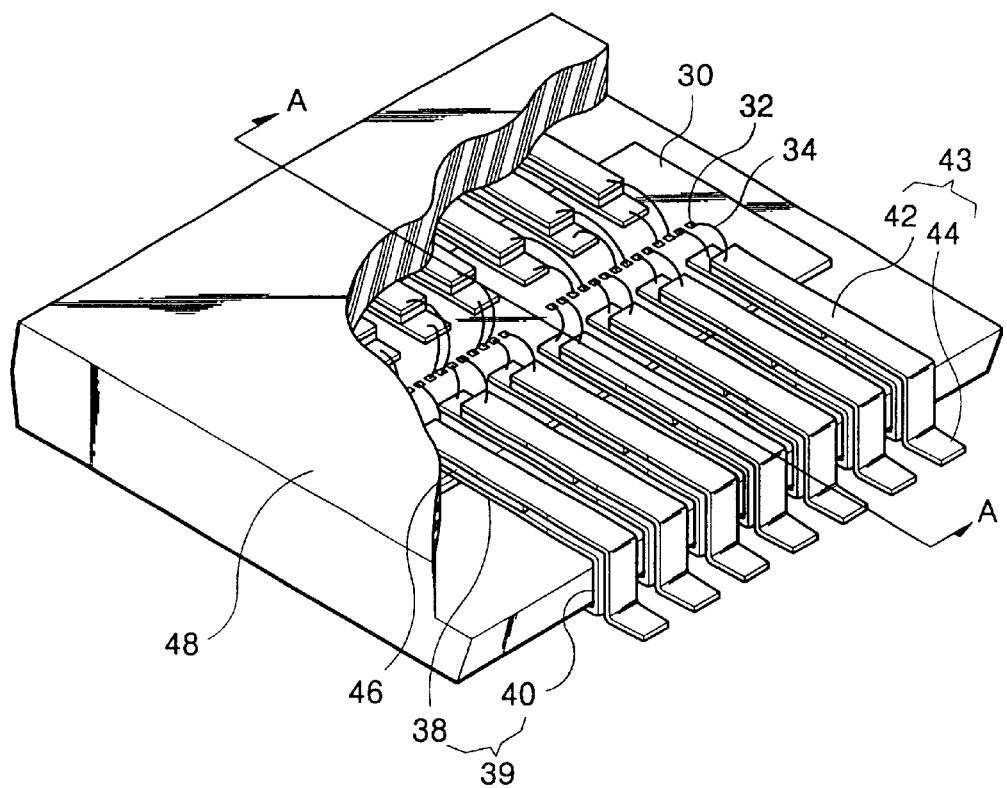
FIG. 2 illustrates one embodiment of a semiconductor chip package with multilevel leads according to the present invention.
Figure 3:
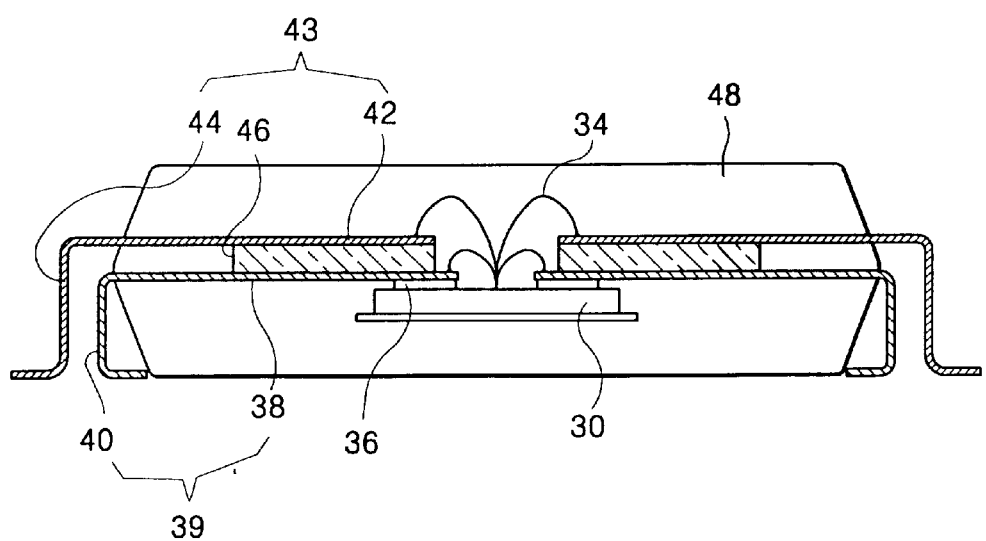
FIG. 3 is a cross-sectional view along line A—A of FIG. 2.

Referring to FIGS. 2 and 3, disclosed is a semiconductor chip package which includes a semiconductor chip 30 having a plurality of contact pads 32, bonding wires 34, two-sided insulating adhesive tapes 36, first leads or lower leads 39, second leads or upper leads 43, and a molded housing 48.

The lower leads 39 each include an inner lead portion 38 and outer lead portion 40. The end of inner lead portion 38 of the lower lead 39 is disposed adjacent to an associated contact pad, and is attached to the chip 30 by the two-sided insulating adhesive tape 36 and electrically coupled to associated contact pads by the bonding wires 34. The outer lead portion 40 which extends from the inner lead portion 38 to the outside of the housing 48 is bent downward at 90 degrees, and then bent inward by 90 degrees forming a J-shaped structure.

The upper leads 43 each include an inner lead portion 42 and an outer lead portion 44. The inner lead portion 42 is disposed overlapping with the inner lead portion 38 of the lower leads 39. An insulator 46 such as polyimide is placed between the inner lead portion 42 and the inner lead portion 38. Preferably, an adhesive is deposited on the upper and lower sides of insulator 46 to which the upper and lower inner lead portions are attached. The inner lead portion 42 of the upper leads 43 are shorter than the inner lead portion 38 of the lower leads 39 to provide an area for wire bonding to inner lead portion 38 of the lower leads 39. The inner lead portion 42 is electrically coupled to an associated contact pad by bonding wires. The outer lead portion 44 extends outside from the inner lead portion 42 to the exterior of housing 48 and is bent downward at 90 degrees, and then bent again outwards at 90 degrees.

The outer lead portion 44 of the upper leads 43 extends further outward of housing 48 than the outer lead portion 40 of the lower leads 39, and is then bent downward at 90 degrees. As illustrated in FIG. 3, the outer lead portions 40 and 44 are spaced apart by a predetermined amount. The end portions of outer lead portions 40 and 44 are bent in opposite directions and are located in the same plane.

Preferably, the lower leads 39 and upper leads 43 are formed from a lower and an upper lead frame, respectively. It is also preferred that the outer lead portions are bent after a molding process.

In the above embodiment of the present invention, the length of the longer side of the package is reduced substantially by using multilevel leads when compared to the prior art structure which uses single-level leads. The electrical resistance of the leads is also reduced because the leads need not include narrowed portions as in the prior art, but can remain full width throughout their length.

Figure 4:
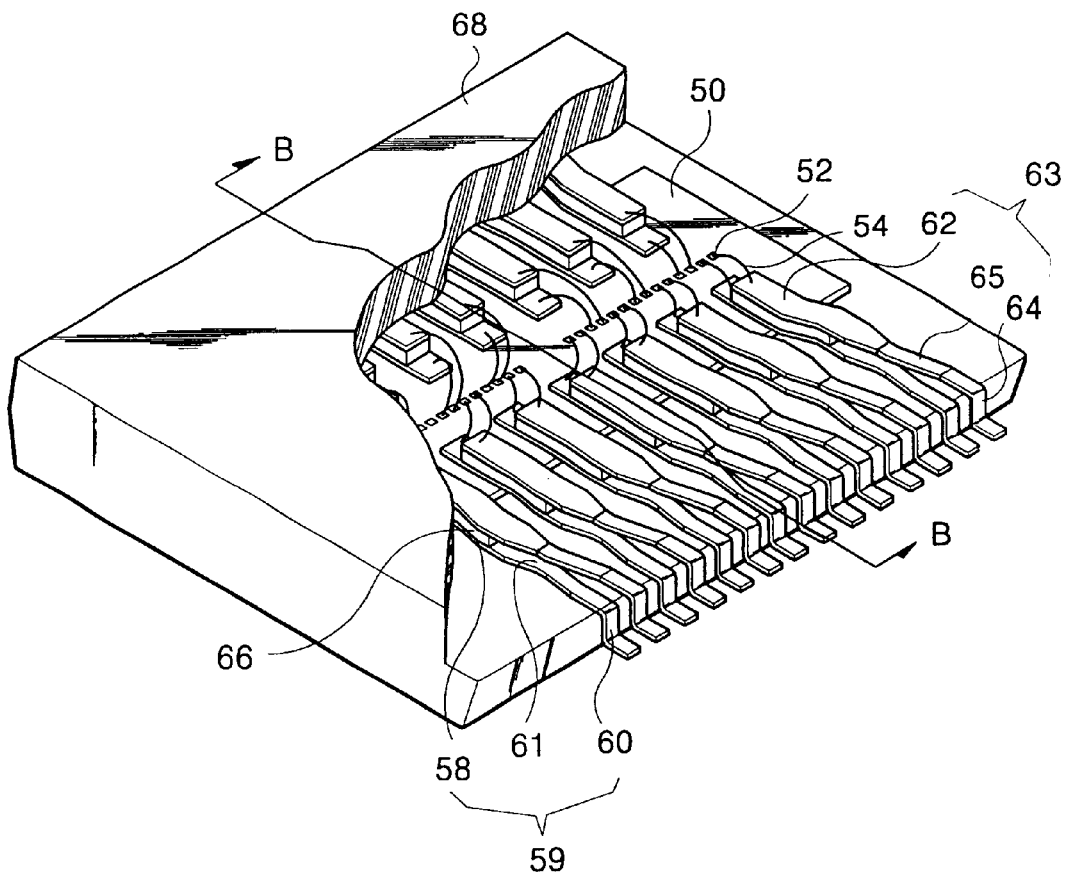
FIG. 4 illustrates a second embodiment of a semiconductor chip package with multilevel leads according to the present invention.
Figure 5:
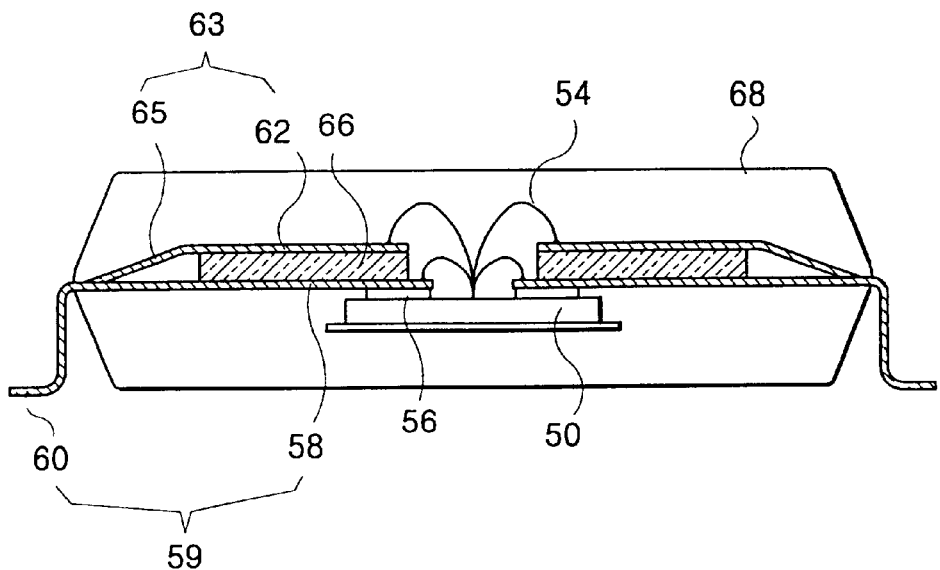
FIG. 5 is a cross-sectional view along line B—B of FIG. 4.

FIGS. 4 and 5 illustrate a second embodiment of a semiconductor chip package with multilevel leads according to the present invention. FIG. 5 is a cross-sectional view along a line B—B of FIG. 4.

In this second embodiment of the present invention, the semiconductor chip 50 includes a plurality of contact pads 52, a plurality of bonding wires 54, two-sided insulating adhesive tapes 56, a plurality of first leads or lower leads 59, a plurality of second leads or upper leads 63 and a molded housing 68.

The lower leads 59 each include a straight portion 58, an oblique portion 61 and an outer portion 60. The straight portions 58 are each electrically coupled to an associated contact pad by bonding wires 54, and extend in a first direction toward the outside of package 68. The oblique portions 61 extend from the straight portions 58 in a left direction (as viewed in FIG. 4) at a predetermined angle. The outer portion 60 of each lead 59 extends from the oblique portion 61 toward the outside of package 68. The outer end of each outer portion 60 is bent downward at 90 degrees along the edge of package 68, and then bent again outward at a 90 degree angle.

The upper leads 63 each include straight portion 62, an oblique portion 65 and an outer portion 64. The straight portions 62 are disposed overlapping the straight portions 58 of the lower leads 59, and an insulator 66, such as polyimide, is disposed between the straight portions 62 and 58. An adhesive is deposited on the upper and lower sides of insulator 66 to attach the straight portions 62 and 58 to insulator 66. The oblique portions 65 extend from the straight portions 62 in right direction (as viewed in FIG. 4) at a predetermined angle. The outer portion 64 of each lead 63 extends from the oblique portion 65 toward the outside of package 68. The outer end of each outer portion 64 is bent downward at 90 degrees along the edge of package 68, and then bent again outward at a 90 degree angle.

The ends of straight portions 62 of the upper leads 63 are shorter than the inner ends of the lower leads 59 by an amount sufficient to provide an area for wire bonding.

The ends of outer lead portions 60 and 64 are located at the same plane, therefore the width and interval of the outer end portions are narrower relative to the first embodiment. However, the package size is reduced relative to the conventional structure having single level leads.

Preferably, the lower leads 59 and upper leads 63 are formed from a lower and an upper lead frame, respectively. It is also preferred that the outer lead portions are bent after a molding process.

As shown above, the present invention can reduce the resistive components and coupling resistance of leads by having multilevel leads, and thereby improve the characteristic of signal flow. Also, the present invention can reduce a package size by having enough space among the leads, and thereby reducing manufacturing costs.

Although the invention has been described with reference to particular embodiments, the description is only an example of the invention's application and should not be taken as a limitation. Various adaptations, omissions, and combinations of features of the embodiments disclosed are within the scope of the invention as defined by the following claims.

What is claimed is:

1. A semiconductor chip package with multilevel leads, comprising:

a semiconductor chip having a plurality of contact pads;

a plurality of first leads each including a straight inner lead portion, an oblique portion and an outer lead portion, said inner lead portion being electrically coupled to a contact pad on said semiconductor chip, said oblique portion extending from said straight portion at a predetermined angle and in a first direction with respect to said straight portion, and said outer lead portion extending outward from said oblique portion;

a plurality of second leads each including a straight inner lead portion, an oblique portion, and an outer lead portion, said straight inner lead portion of said second leads being disposed overlapping said straight inner lead portion of said first leads with an insulator disposed therebetween, each of said straight inner lead portions being electrically coupled to a contact pad on said semiconductor chip, and said oblique portion extending from said straight portion at a predetermined angle and in a second direction, opposite said first direction, and said outer lead portion extending outwardly from said oblique portion, said outer lead portions of said first plurality of leads and said outer lead portions of said second plurality of leads being coplanar; and a molded housing encapsulating said semiconductor chip, said inner lead portions and said oblique portions of said plurality of first and second leads.

2. The semiconductor chip package as recited in claim 1, wherein each of said outer lead portions of said first and second leads has a width less than a width of said respective inner lead portion of said first and second leads.

3. A lead-on-chip package with multilevel leads, comprising:

a semiconductor chip having a plurality of contact pads thereon arranged in a row;

a plurality of first leads disposed on said semiconductor chip, each of said first leads including an inner lead portion electrically coupled to a contact pad and an outer lead portion extending from said inner lead portion, said inner lead portion having a straight section and an oblique section, said oblique section extending in a first direction from said straight section to said outer lead portion;

a plurality of second leads disposed above said first leads, each of said second leads including an inner lead portion electrically coupled to a contact pad on said semiconductor chip and an outer lead portion extending from said inner lead portion, said inner lead portion having a straight section and an oblique section, at least a portion of said straight section of each second lead overlapping said straight section of a corresponding first lead, said oblique section of said second lead extending in a second direction from said straight section to said outer lead portion, said second direction differing from said first direction;

an insulator interposed between a portion of said first leads and a portion of said second leads; and a housing encapsulating said semiconductor chip and said inner lead portion said plurality of first and second leads.

4. The lead-on-chip package as recited in claim 3, wherein each of said outer lead portions of said first and second leads has a first section and a second section, said second sections of said outer lead portions of said first and second leads being substantially coplanar.

5. The lead-on-chip package as recited in claim 3, wherein each of said outer lead portions of said first and second leads has a width that is less than a width of said respective inner lead portion of said first and second leads.

6. A semiconductor chip package with multilevel leads comprising:

a semiconductor chip having a plurality of contact pads;

a plurality of first leads each including an inner lead portion electrically coupled to a contact pad on said semiconductor chip, and an outer lead portion extending from said inner lead portion to be exposed outside the package, each inner lead portion having a straight section and an oblique section, said oblique section extending in a first direction from said straight portion to said outer lead portion;

a plurality of second leads disposed overlapping said plurality of first leads and electrically insulated from said plurality of first leads, each second lead including an inner lead portion electrically coupled to a contact pad on said semiconductor chip and an outer lead portion extending from the inner portion to be exposed outside the package, each inner lead portion of said second leads having a straight section and an oblique section, at least a portion of said straight section of each second lead overlapping said straight section of said corresponding first lead, said oblique section of said second lead extending in a second direction from said straight portion to said outer lead portion, said second direction differing from said first direction; and a molded housing encapsulating said semiconductor chip, and the inner lead portions of said plurality of first and second leads.

7. The semiconductor chip package as claimed in claim 6, wherein said straight sections of said inner lead portions of said first leads are substantially parallel to said corresponding straight sections of said inner lead portions of said second leads.

* * * * *